United States Patent
McChesney et al.

(10) Patent No.: US 11,605,546 B2
(45) Date of Patent: *Mar. 14, 2023

(54) MOVEABLE EDGE COUPLING RING FOR EDGE PROCESS CONTROL DURING SEMICONDUCTOR WAFER PROCESSING

(71) Applicant: Lam Research Corporation, Fremont, CA (US)

(72) Inventors: Jon McChesney, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 554 days.

This patent is subject to a terminal disclaimer.

(21) Appl. No.: 14/598,943

(22) Filed: Jan. 16, 2015

(65) Prior Publication Data

US 2016/0211165 A1 Jul. 21, 2016

(51) Int. Cl.
*H01L 21/67* (2006.01)
*H01L 21/687* (2006.01)
*H01J 37/32* (2006.01)

(52) U.S. Cl.
CPC .. *H01L 21/67069* (2013.01); *H01J 37/32642* (2013.01); *H01L 21/68735* (2013.01); *H01L 21/68742* (2013.01)

(58) Field of Classification Search
None
See application file for complete search history.

(56) References Cited

U.S. PATENT DOCUMENTS

| | | |
|---|---|---|
| 5,660,673 A | 8/1997 | Miyoshi |
| 5,762,714 A | 6/1998 | Mohn et al. |
| 6,022,809 A | 2/2000 | Fan |
| 6,044,534 A | 4/2000 | Seo et al. |
| 6,206,976 B1 | 3/2001 | Crevasse et al. |
| 6,589,352 B1 | 7/2003 | Yudovsky et al. |
| 6,744,212 B2 | 6/2004 | Fischer et al. |
| 6,896,765 B2 | 5/2005 | Steger |
| 6,898,558 B2 | 5/2005 | Klekotka |
| 7,968,469 B2 | 6/2011 | Collins et al. |
| 8,999,106 B2 | 4/2015 | Liu et al. |
| 9,011,637 B2 | 4/2015 | Yamamoto |

(Continued)

FOREIGN PATENT DOCUMENTS

| | | |
|---|---|---|
| CN | 102243977 A | 11/2011 |
| JP | 2001230239 A * | 8/2001 |

(Continued)

OTHER PUBLICATIONS

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.

(Continued)

*Primary Examiner* — Karla A Moore
*Assistant Examiner* — Margaret Klunk

(57) ABSTRACT

A substrate processing system includes a processing chamber. A pedestal is arranged in the processing chamber. An edge coupling ring is arranged adjacent to the pedestal and around a radially outer edge of the substrate. An actuator is configured to selectively move a first portion of the edge coupling ring relative to the substrate to alter an edge coupling profile of the edge coupling ring.

10 Claims, 7 Drawing Sheets

(56) References Cited

U.S. PATENT DOCUMENTS

| | | |
|---|---|---|
| 9,142,391 B2 | 9/2015 | Yamamoto |
| 2002/0072240 A1* | 6/2002 | Koike ................ H01J 37/32642 438/710 |
| 2003/0201069 A1* | 10/2003 | Johnson ............ H01J 37/32082 156/345.43 |
| 2004/0053428 A1* | 3/2004 | Steger ............... H01J 37/32642 438/10 |
| 2004/0149389 A1 | 8/2004 | Fink |
| 2008/0223873 A1 | 9/2008 | Chen et al. |
| 2008/0236749 A1* | 10/2008 | Koshimizu ....... H01J 37/32642 156/345.33 |
| 2009/0056629 A1 | 3/2009 | Katz et al. |
| 2009/0067954 A1 | 3/2009 | Lanee et al. |
| 2009/0078196 A1* | 3/2009 | Midorikawa ..... H01L 21/30655 118/708 |
| 2009/0197423 A1 | 8/2009 | Koshimizu et al. |
| 2010/0025369 A1 | 2/2010 | Negishi et al. |
| 2011/0031111 A1 | 2/2011 | Kobayashi |
| 2011/0287631 A1 | 11/2011 | Yamamoto |
| 2012/0305184 A1* | 12/2012 | Singh .................... H01J 37/321 156/345.3 |
| 2013/0106286 A1 | 5/2013 | Banna et al. |
| 2013/0157388 A1 | 6/2013 | Grimbergen |
| 2014/0213055 A1 | 7/2014 | Himori et al. |
| 2014/0273460 A1 | 9/2014 | Reyland et al. |
| 2015/0181684 A1 | 6/2015 | Banna et al. |
| 2015/0340209 A1* | 11/2015 | Koltonski ......... H01J 37/32715 156/345.31 |
| 2016/0211165 A1 | 7/2016 | McChesney et al. |
| 2016/0211166 A1 | 7/2016 | Yan et al. |
| 2017/0018407 A1 | 1/2017 | Kondo |

FOREIGN PATENT DOCUMENTS

| | | |
|---|---|---|
| JP | 2015201552 A | 11/2015 |
| TW | 506234 B | 10/2002 |
| TW | 201207933 A | 2/2012 |
| TW | 201324653 A | 6/2013 |
| TW | 201436089 A | 9/2014 |

OTHER PUBLICATIONS

First Office Action dated Dec. 29, 2017 corresponding to Chinese Patent Application No. 201610032252.1, 12 pages.

* cited by examiner

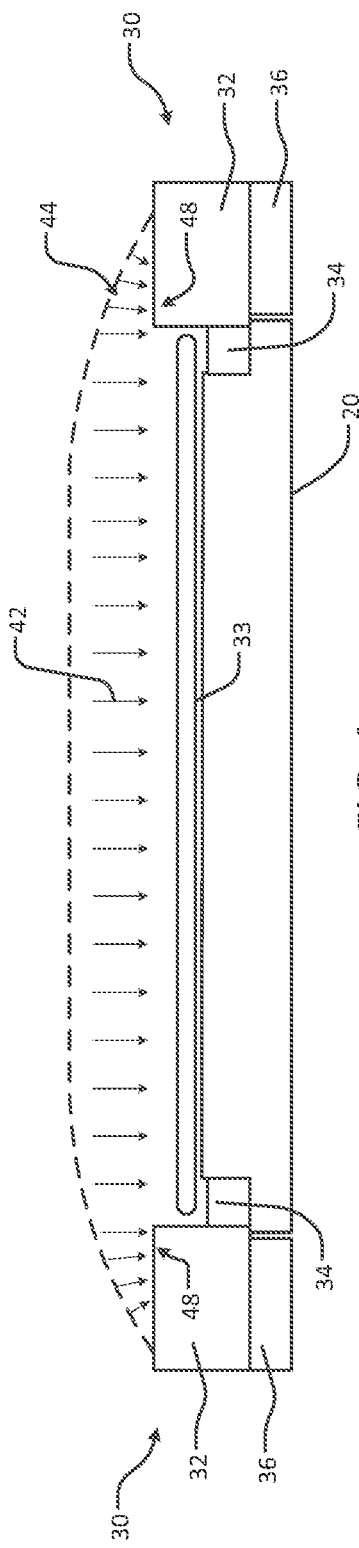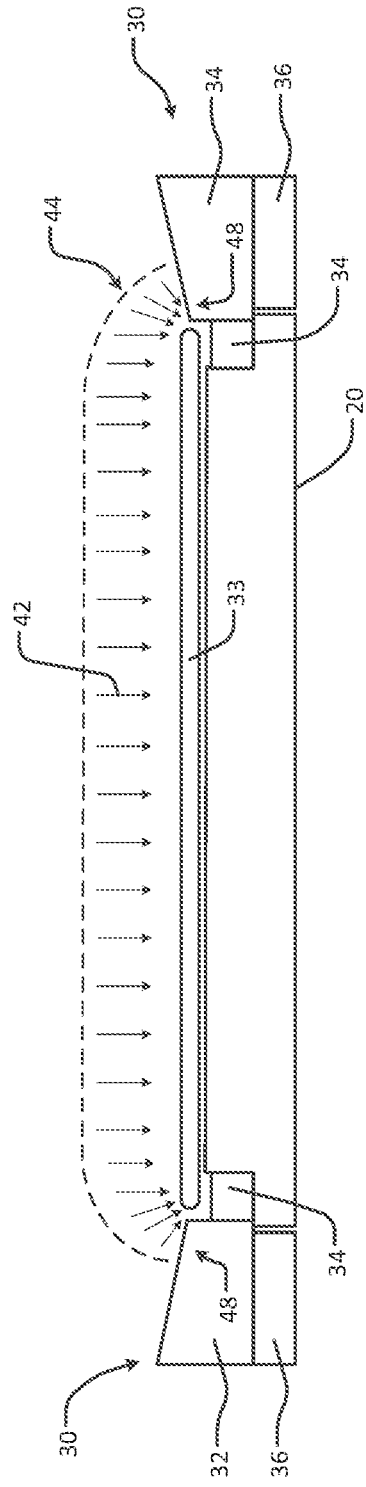
FIG. 1
Prior Art
FIG. 2
Prior Art

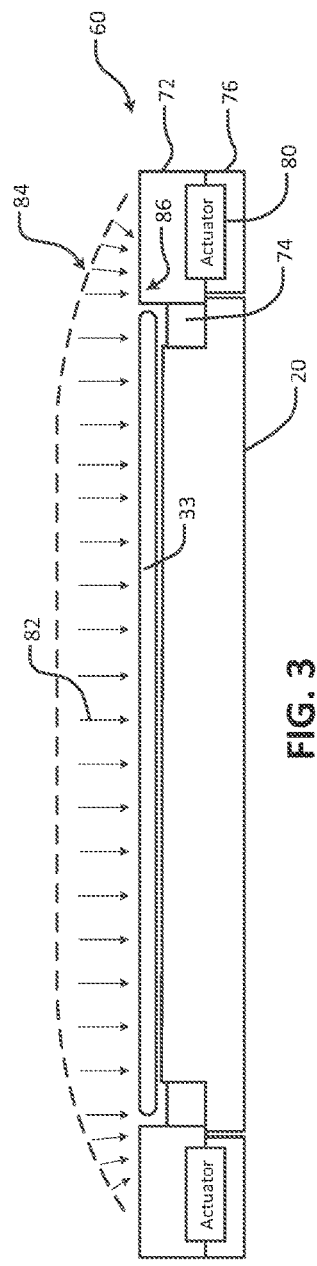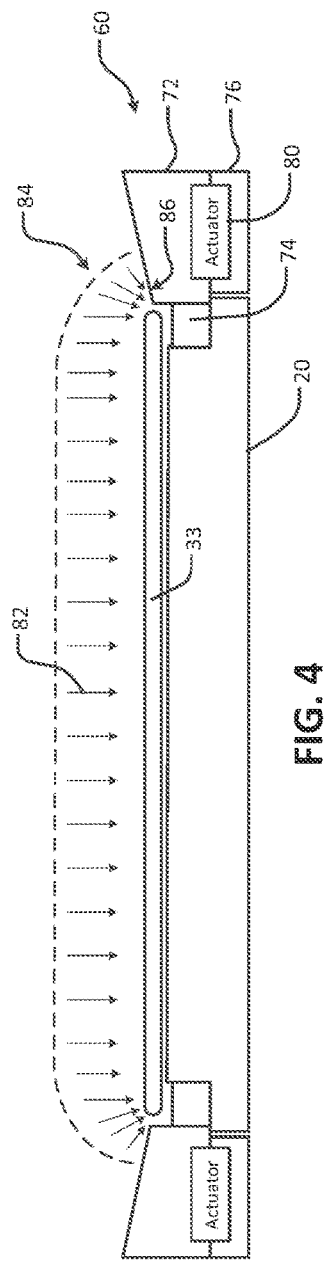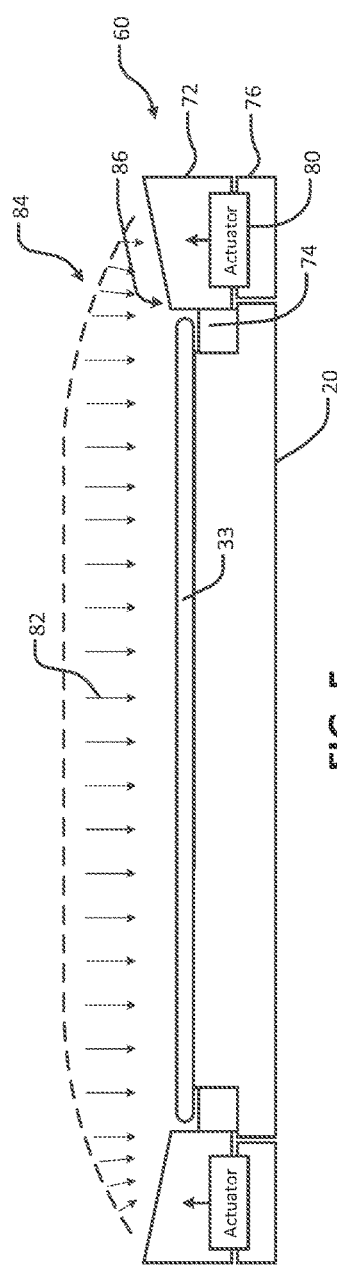

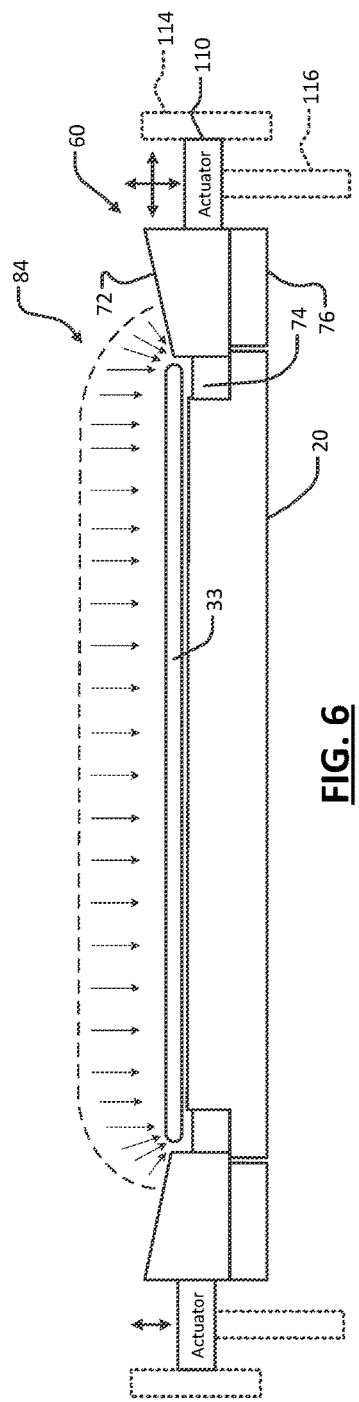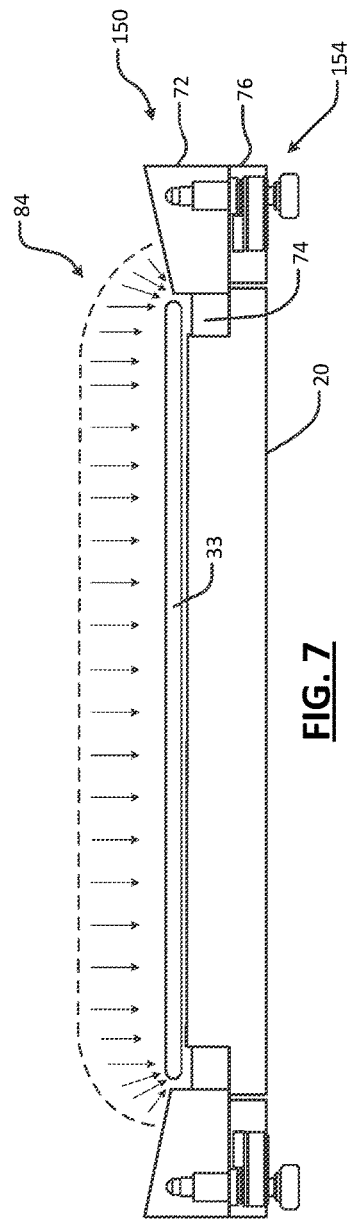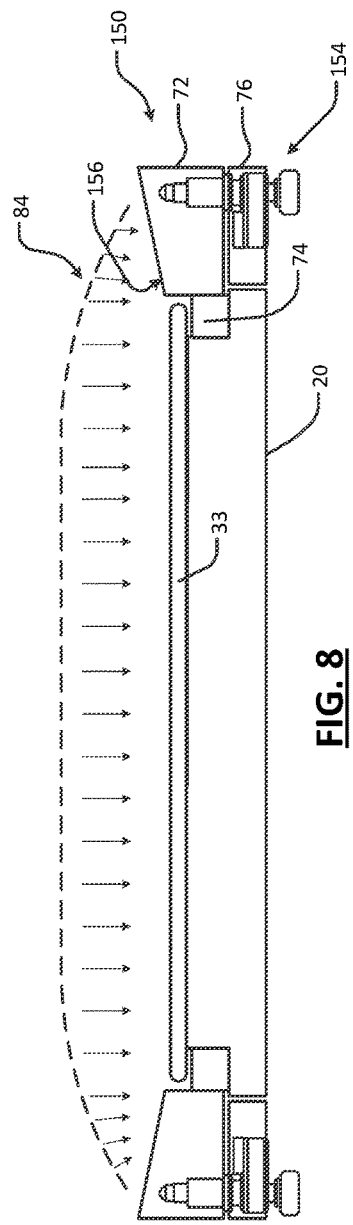

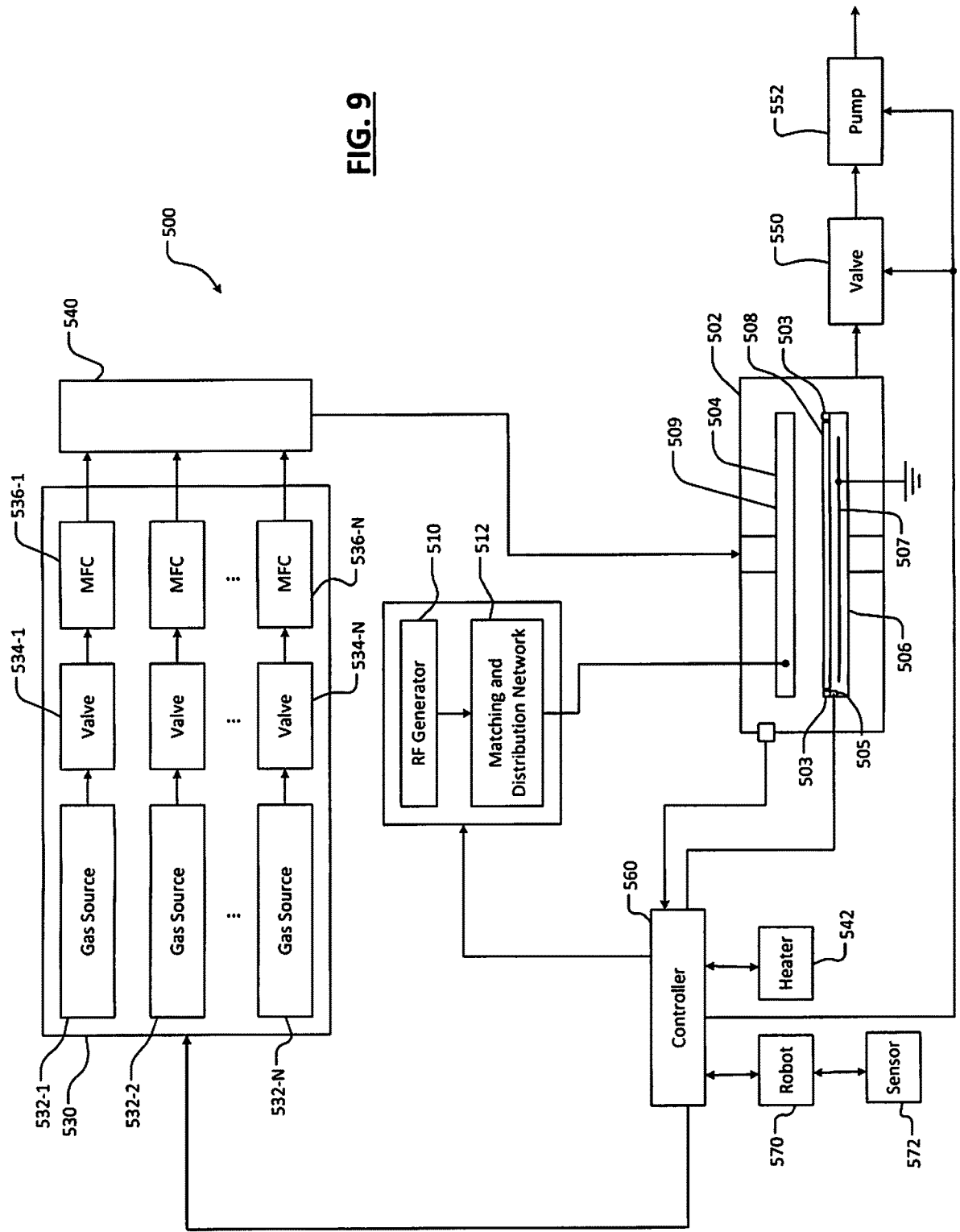

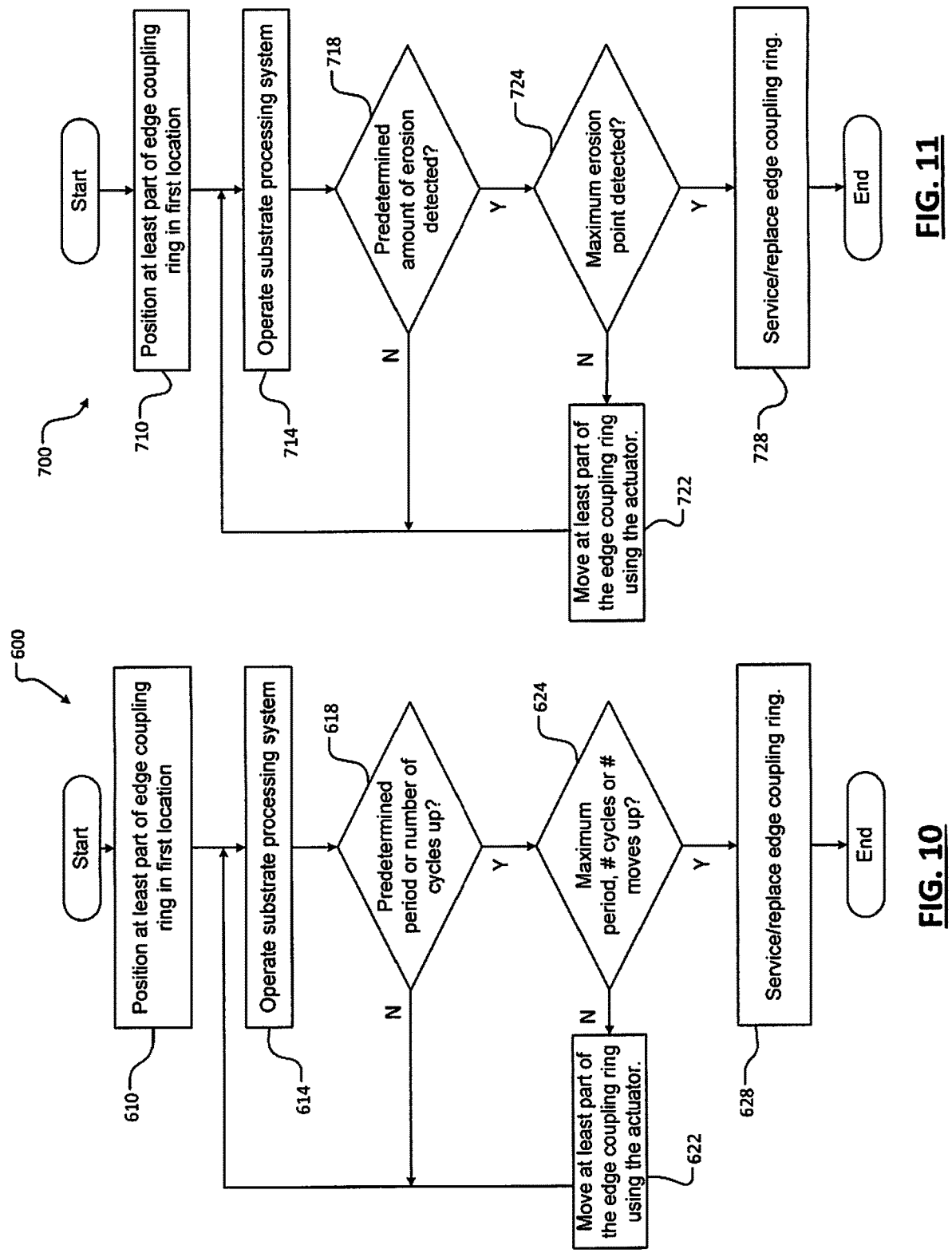

MOVEABLE EDGE COUPLING RING FOR EDGE PROCESS CONTROL DURING SEMICONDUCTOR WAFER PROCESSING

FIELD

The present disclosure relates to substrate processing systems, and more particularly to edge coupling rings of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. A substrate may be arranged on a pedestal in a processing chamber of the substrate processing system. For example during etching in a plasma enhanced chemical vapor deposition (PECVD) process, a gas mixture including one or more precursors is introduced into the processing chamber and plasma is struck to etch the substrate.

Edge coupling rings have been used to adjust an etch rate and/or etch profile of the plasma near a radially outer edge of the substrate. The edge coupling ring is typically located on the pedestal around the radially outer edge of the substrate. Process conditions at the radially outer edge of the substrate can be modified by changing a position of the edge coupling ring, a shape or profile of an inner edge of the edge coupling ring, a height of the edge coupling ring relative to an upper surface of the substrate, a material of the edge coupling ring, etc.

Changing the edge coupling ring requires the processing chamber to be opened, which is undesirable. In other words, an edge coupling effect of the edge coupling ring cannot be altered without opening the processing chamber. When the edge coupling ring is eroded by plasma during etching, the edge coupling effect changes. Correcting erosion of the edge coupling ring requires the processing chamber to be opened in order to replace the edge coupling ring.

Referring now to FIGS. 1-2, a substrate processing system may include a pedestal 20 and an edge coupling ring 30. The edge coupling ring 30 may include a single piece or two or more portions. In the example in FIGS. 1-2, the edge coupling ring 30 includes a first annular portion 32 arranged near a radially outer edge of a substrate 33. A second annular portion 34 is located radially inwardly from the first annular portion below the substrate 33. A third annular portion 36 is arranged below the first annular portion 32. During use, plasma 42 is directed at the substrate 33 to etch the exposed portions of the substrate 33. The edge coupling ring 30 is arranged to help shape the plasma such that uniform etching of the substrate 33 occurs.

In FIG. 2, after the edge coupling ring 30 has been used, an upper surface of a radially inner portion of the edge coupling ring 30 may exhibit erosion as identified at 48. As a result, plasma 42 may tend to etch a radially outer edge of the substrate 33 at a faster rate than etching of radially inner portions thereof as can be seen at 44.

SUMMARY

A substrate processing system includes a processing chamber. A pedestal is arranged in the processing chamber. An edge coupling ring is arranged adjacent to the pedestal and around a radially outer edge of the substrate. An actuator is configured to selectively move a first portion of the edge coupling ring relative to the substrate to alter an edge coupling profile of the edge coupling ring.

In other features, a gas delivery system is configured to deliver process gas and carrier gas to the processing chamber. A plasma generator is configured to create plasma in the processing chamber to etch the substrate. The actuator moves the first portion of the edge coupling ring without requiring the processing chamber to be opened.

In other features, the edge coupling ring further comprises a second portion. The actuator is configured to move the first portion of the edge coupling ring relative the second portion of the edge coupling ring. The actuator includes a piezoelectric actuator. The actuator includes a stepper motor actuator. The actuator includes a pneumatic drive actuator.

In other features, a controller is configured to move the edge coupling ring in response to erosion of a plasma-facing surface of the edge coupling ring. The controller automatically moves the edge coupling ring after the edge coupling ring is exposed to a predetermined number of etching cycles. The controller automatically moves the edge coupling ring after the edge coupling ring is exposed to a predetermined period of etching.

In other features, the actuator moves the first portion of the edge coupling ring vertically relative to the substrate. The actuator moves the first portion of the edge coupling ring horizontally relative to the substrate. A sensor is configured to communicate with the controller and to detect the erosion of the edge coupling ring.

In other features, a robot is configured to communicate with the controller and to adjust a position of the sensor. The sensor includes a depth gauge. The sensor includes a laser interferometer. The actuator selectively tilts the edge coupling ring relative to the substrate. The actuator is located outside of the processing chamber. A rod member connects the actuator to the edge coupling ring through a wall of the processing chamber.

In other features, a seal is arranged between the rod member and the wall of the processing chamber. A controller is configured to move the edge coupling ring to a first position for a first treatment of the substrate using a first edge coupling effect and then to a second position for a second treatment of the substrate using a second edge coupling effect.

A method for adjusting an edge coupling profile of an edge coupling ring in a substrate processing system includes arranging an edge coupling ring adjacent to a pedestal in a processing chamber. The edge coupling ring is arranged around a radially outer edge of the substrate. The method includes selectively moving a first portion of the edge coupling ring relative to the substrate using an actuator to alter an edge coupling profile of the edge coupling ring.

In other features, the method includes delivering process gas and carrier gas to the processing chamber. The method includes creating plasma in the processing chamber to etch the substrate. The method includes moving the first portion of the edge coupling ring using the actuator without requiring the processing chamber to be opened. The edge coupling ring further comprises a second portion. The actuator is configured to move the first portion of the edge coupling ring relative the second portion of the edge coupling ring. The actuator is selected from a group consisting of a piezoelectric actuator, a stepper motor actuator, and a pneumatic drive actuator.

In other features, the method includes moving the edge coupling ring in response to erosion of a plasma-facing surface of the edge coupling ring. The method includes automatically moving the edge coupling ring after the edge coupling ring is exposed to a predetermined number of etching cycles. The method includes automatically moving the edge coupling ring after the edge coupling ring is exposed to a predetermined period of etching. The method includes moving the first portion of the edge coupling ring vertically relative to the substrate. The method includes moving the first portion of the edge coupling ring horizontally relative to the substrate.

In other features, the method includes using a sensor to sense erosion of the edge coupling ring. The sensor is selected from a group consisting of a depth gauge and a laser interferometer. The method includes selectively tilting the edge coupling ring relative to the substrate. The actuator is located outside of the processing chamber.

In other features, the method includes moving the edge coupling ring to a first position for a first treatment of the substrate using a first edge coupling effect and moving the edge coupling ring to a second position for a second treatment of the substrate using a second edge coupling effect.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a side cross-sectional view of a pedestal and an edge coupling ring according to the prior art;

FIG. 2 is a side cross-sectional view of a pedestal and an edge coupling ring according to the prior art after erosion of the edge coupling ring has occurred;

FIG. 3 is a side cross-sectional view of an example of a pedestal, an edge coupling ring and an actuator according to the present disclosure;

FIG. 4 is a side cross-sectional view of the pedestal, the edge coupling ring and the actuator of FIG. 3 after erosion of the edge coupling ring has occurred;

FIG. 5 is a side cross-sectional view of the pedestal, the edge coupling ring and the actuator of FIG. 3 after erosion of the edge coupling ring has occurred and the actuator is moved;

FIG. 6 is a side cross-sectional view of another example of a pedestal, an edge coupling ring and an actuator located in another position according to the present disclosure;

FIG. 7 is a side cross-sectional view of another example of a pedestal, an edge coupling ring and a piezoelectric actuator according to the present disclosure;

FIG. 8 is a side cross-sectional view of the pedestal, the edge coupling ring and the piezoelectric actuator of FIG. 7 after erosion has occurred and the piezoelectric actuator is moved;

FIG. 9 is a functional block diagram of an example of a substrate processing chamber including a pedestal, an edge coupling ring and an actuator according to the present disclosure;

FIG. 10 is a flowchart illustrating steps of an example of a method for operating the actuator to move the edge coupling ring according to the present disclosure;

FIG. 11 is a flowchart illustrating steps of another example of a method for operating the actuator to move the edge coupling ring according to the present disclosure;

In the drawings, reference numbers may be reused to identify similar and/or identical elements.

DETAILED DESCRIPTION

Figure 12:
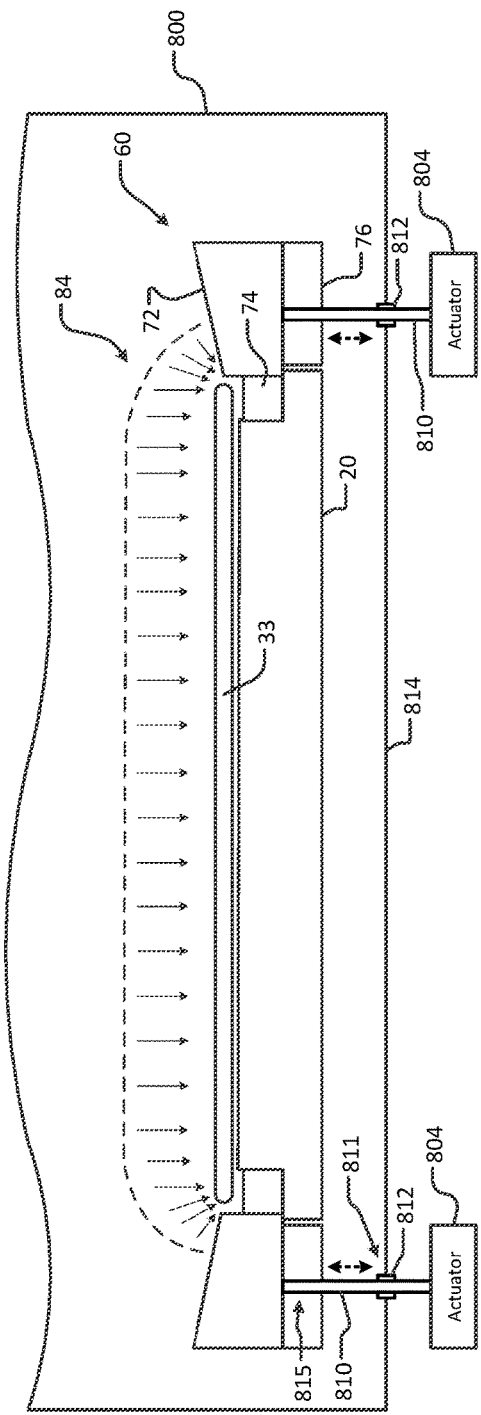
FIG. 12 is a functional block diagram of an example of a processing chamber including an edge coupling ring movable by actuators arranged outside of the processing chamber according to the present disclosure.

The present disclosure allows one or more portions of an edge coupling ring to be moved vertically and/or horizontally relative to a substrate or pedestal in a substrate processing system. The movement changes an edge coupling effect of the plasma relative to the substrate during etching or other substrate treatment without requiring the processing chamber to be opened.

Referring now to FIGS. 3-5, a substrate processing system includes a pedestal 20 and an edge coupling ring 60. The edge coupling ring 60 may be made of a single portion or two or more portions may be used. In the example in FIGS. 3-5, the edge coupling ring 60 includes a first annular portion 72 arranged radially outside of the substrate 33. A second annular portion 74 is located radially inwardly from the first annular portion 72 below the substrate 33. A third annular portion 76 is arranged below the first annular portion 72.

An actuator 80 may be arranged in various locations to move one or more portions of the edge coupling ring 60 relative to the substrate 33 as will be described further below. For example only, in FIG. 3 the actuator 80 is arranged between the first annular portion 72 of the edge coupling ring 60 and the third annular portion 76 of the edge coupling ring 60. In some examples, the actuator 80 may include a piezoelectric actuator, a stepper motor, a pneumatic drive, or other suitable actuator. In some examples, one, two, three, or four or more actuators are used. In some examples, multiple actuators are arranged uniformly around the edge coupling ring 60. The actuator(s) 80 may be arranged inside or outside of the processing chamber.

During use, plasma 82 is directed at the substrate 33 to etch the exposed portions of the substrate 33. The edge coupling ring 60 is arranged to help shape the plasma electric field such that uniform etching of the substrate 33 occurs. As can be seen at 84 and 86 in FIG. 4, one or more portions of the edge coupling ring 60 may be eroded by the plasma 82. As a result of the erosion, non-uniform etching of the substrate 33 may occur near a radially outer edge of the substrate 33. Normally, the process would need to be stopped, the processing chamber opened and the edge coupling ring replaced.

In FIG. 5, the actuator 80 is used to move one or more portions of the edge coupling ring 60 to alter the position of the one or more portions of the edge coupling ring 60. For example, the actuator 80 may be used to move the first annular portion 72 of the edge coupling ring 60. In this example, the actuator 80 moves the first annular portion 72 of the edge coupling ring 60 in an upward or vertical direction such that an edge 86 of the first annular portion 72 of the edge coupling ring 60 is higher relative to the radially outer edge of the substrate 33. As a result, etch uniformity near the radially outer edge of the substrate 33 is improved.

Referring now to FIG. 6, as can be appreciated, the actuator may be arranged in one or more other locations and may move in other directions such as horizontal, diagonal, etc. Horizontal movement of the portion of the edge coupling ring may be performed to center the edge coupling effect relative to the substrate. In FIG. 6, an actuator 110 is arranged radially outside of the edge coupling ring 60. In addition, the actuator 110 moves in a vertical (or an up/down) direction as well as in a horizontal (or side to side) direction. Horizontal repositioning may be used when etching of the substrates shows a horizontal offset of the edge coupling ring relative to the substrates. The horizontal offset may be corrected without opening the processing chamber. Likewise, tilting of the edge coupling ring may be performed by actuating some of the actuators differently than others of the actuators to correct or create side-to-side asymmetry.

Rather than locating the actuator 110 between annular portions of the edge coupling ring, the actuator 110 may also be attached to a radially outer wall or other structure identified at 114. Alternately, the actuator 110 may be supported from below by a wall or other structure identified at 116.

Referring now to FIG. 7-8, another example of an edge coupling ring 150 and a piezoelectric actuator 154 is shown. In this example, the piezoelectric actuator 154 moves the edge coupling ring 150. The piezoelectric actuator 154 is mounted in the first annular portion 72 and the third annular portion 76 of the edge coupling ring 150. In FIG. 8, the piezoelectric actuator 154 moves the first annular portion 72 of the edge coupling ring 150 to adjust a position of an edge 156 of the first annular portion 72.

Referring now to FIG. 9, an example of a substrate processing chamber 500 for performing etching using RF plasma is shown. The substrate processing chamber 500 includes a processing chamber 502 that encloses other components of the substrate processing chamber 500 and contains the RF plasma. The substrate processing chamber 500 includes an upper electrode 504 and a pedestal 506 including a lower electrode 507. An edge coupling ring 503 is supported by the pedestal 506 and is arranged around the substrate 508. One or more actuators 505 may be used to move the edge coupling ring 503. During operation, a substrate 508 is arranged on the pedestal 506 between the upper electrode 504 and the lower electrode 507.

For example only, the upper electrode 504 may include a showerhead 509 that introduces and distributes process gases. The showerhead 509 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 504 may include a conducting plate and the process gases may be introduced in another manner. The lower electrode 507 may be arranged in a non-conductive pedestal. Alternately, the pedestal 506 may include an electrostatic chuck that includes a conductive plate that acts as the lower electrode 507.

An RF generating system 510 generates and outputs an RF voltage to one of the upper electrode 504 and the lower electrode 507. The other one of the upper electrode 504 and the lower electrode 507 may be DC grounded, AC grounded or floating. For example only, the RF generating system 510 may include an RF voltage generator 511 that generates the RF voltage that is fed by a matching and distribution network 512 to the upper electrode 504 or the lower electrode 507. In other examples, the plasma may be generated inductively or remotely.

A gas delivery system 530 includes one or more gas sources 532-1, 532-2, . . . , and 532-N (collectively gas sources 532), where N is an integer greater than zero. The gas sources supply one or more precursors and mixtures thereof. The gas sources may also supply purge gas. Vaporized precursor may also be used. The gas sources 532 are connected by valves 534-1, 534-2, . . . , and 534-N (collectively valves 534) and mass flow controllers 536-1, 536-2, . . . , and 536-N (collectively mass flow controllers 536) to a manifold 540. An output of the manifold 540 is fed to the processing chamber 502. For example only, the output of the manifold 540 is fed to the showerhead 509.

A heater 542 may be connected to a heater coil (not shown) arranged in the pedestal 506. The heater 542 may be used to control a temperature of the pedestal 506 and the substrate 508. A valve 550 and pump 552 may be used to evacuate reactants from the processing chamber 502. A controller 560 may be used to control components of the substrate processing chamber 500. The controller 560 may also be used to control the actuator 505 to adjust a position of one or more portions of the edge coupling ring 503.

A robot 570 and a sensor 572 may be used to measure erosion of the edge coupling ring. In some examples, the sensor 572 may include a depth gauge. The robot 570 may move the depth gauge in contact with the edge coupling ring to measure erosion. Alternately, a laser interferometer (with or without the robot 570) may be used to measure erosion without direct contact. The robot 570 may be omitted if the laser interferometer can be positioned with a direct line of sight to the edge coupling ring.

Referring now to FIG. 10, an example of a method 600 for operating the actuator to move the edge coupling ring is shown. At 610, at least part of an edge coupling ring is positioned in a first location relative to the substrate. At 614, the substrate processing system is operated. The operation may include etching or other treatment of a substrate. At 618, control determines whether a predetermined period of etching or a predetermined number etching cycles have occurred. If the predetermined period or number of cycles is not exceeded as determined at 618, control returns to 614.

When the predetermined period or number of cycles are up, control determines at 624 whether a maximum predetermined etching period is up, a maximum number of etching cycles has occurred and/or a maximum # of actuator moves have occurred.

If 624 is false, control moves at least part of the edge coupling ring using the actuator. Movement of the edge coupling ring can be performed automatically, manually or a combination thereof without opening the processing chamber. If 624 is true, control sends a message or otherwise indicates that the edge coupling ring should be serviced/replaced.

Referring now to FIG. 11, an example of a method 700 for operating the actuator to move the edge coupling ring is shown. At 710, at least part of an edge coupling ring is positioned in a first location relative to the substrate. At 714, the substrate processing system is operated. The operation may include etching or other treatment of a substrate. At 718, control determines whether a predetermined amount of erosion of the edge coupling ring has occurred using a sensor such as a depth gauge or laser interferometer. If 718 is false, control returns to 714.

When the predetermined amount of erosion has occurred, control determines at 724 whether a maximum amount of erosion has occurred. If 724 is false, control moves at least part of the edge coupling ring using the actuator. Movement of the edge coupling ring can be performed automatically, manually or a combination thereof without opening the processing chamber. If 724 is true, control sends a message or otherwise indicates that the edge coupling ring should be serviced/replaced.

In addition to the foregoing, a determination of whether or not the edge coupling ring needs to be moved may be based on inspection of etching patterns of the substrates after processing. The actuator may be used to adjust the edge coupling profile of the edge coupling ring without opening the chamber.

Referring now to FIG. 12, a processing chamber 800 includes an edge coupling ring 60 arranged on a pedestal 20. The edge coupling ring 60 includes one or more portions that are movable by one or more actuators 804 arranged outside of the processing chamber 800. In this example, the portion 72 is movable. The actuators 804 may be connected by mechanical linkage 810 to the portion 72 of the edge coupling ring 60. For example, the mechanical linkage 810 may include a rod member. The mechanical linkage 810 may pass through a hole 811 in a wall 814 of the processing chamber 800. A seal 812 such as an "O"-ring may be used. The mechanical linkage 810 may pass through holes 815 in one or more structures such as the portion 76 of the edge coupling ring 60.

Figure 13A:
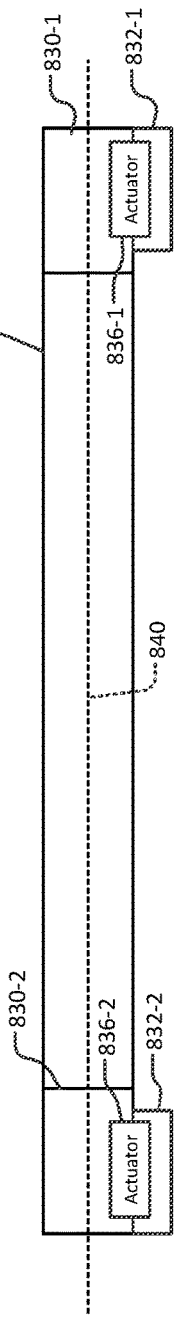
FIGS. 13A and 13B illustrates an example of side-to-side tilting of an edge coupling ring according to the present disclosure.
Figure 13B:
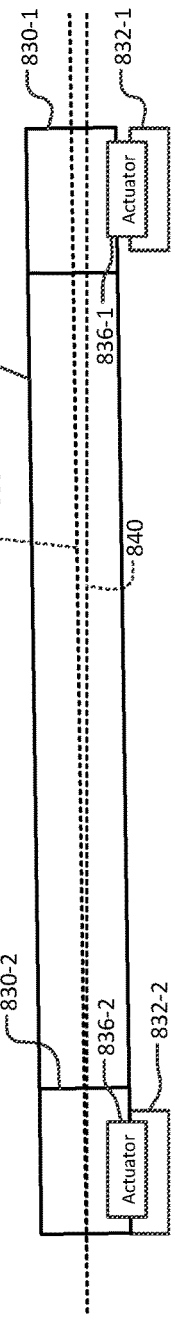

Referring now to FIGS. 13A and 13B, side-to-side tilting of an edge coupling ring 830 is shown. Side-to-side tilting may be used to correct side-to-side misalignment. In FIG. 13A, portions 830-1 and 830-2 of an edge coupling ring 830 on opposite sides of the substrate are arranged in a first arrangement 840. The portions 830-1 and 830-2 may be generally aligned with portions 832-1 and 832-2 of the edge coupling ring 830. Actuators 836-1 and 836-2 are arranged between the portions 830-1 and 832-1 and 830-2 and 832-2, respectively.

In FIG. 13B, the actuators 836-1 and 836-2 move the respective portions of the edge coupling ring 830 such that the edge coupling ring 830 moves to a second arrangement 850 that is different than the first arrangement 840 shown in FIG. 13A. As can be appreciated, the substrates may be inspected after treatment and the tilt relative to the substrate may be adjusted as needed without opening the processing chamber.

Figure 14:
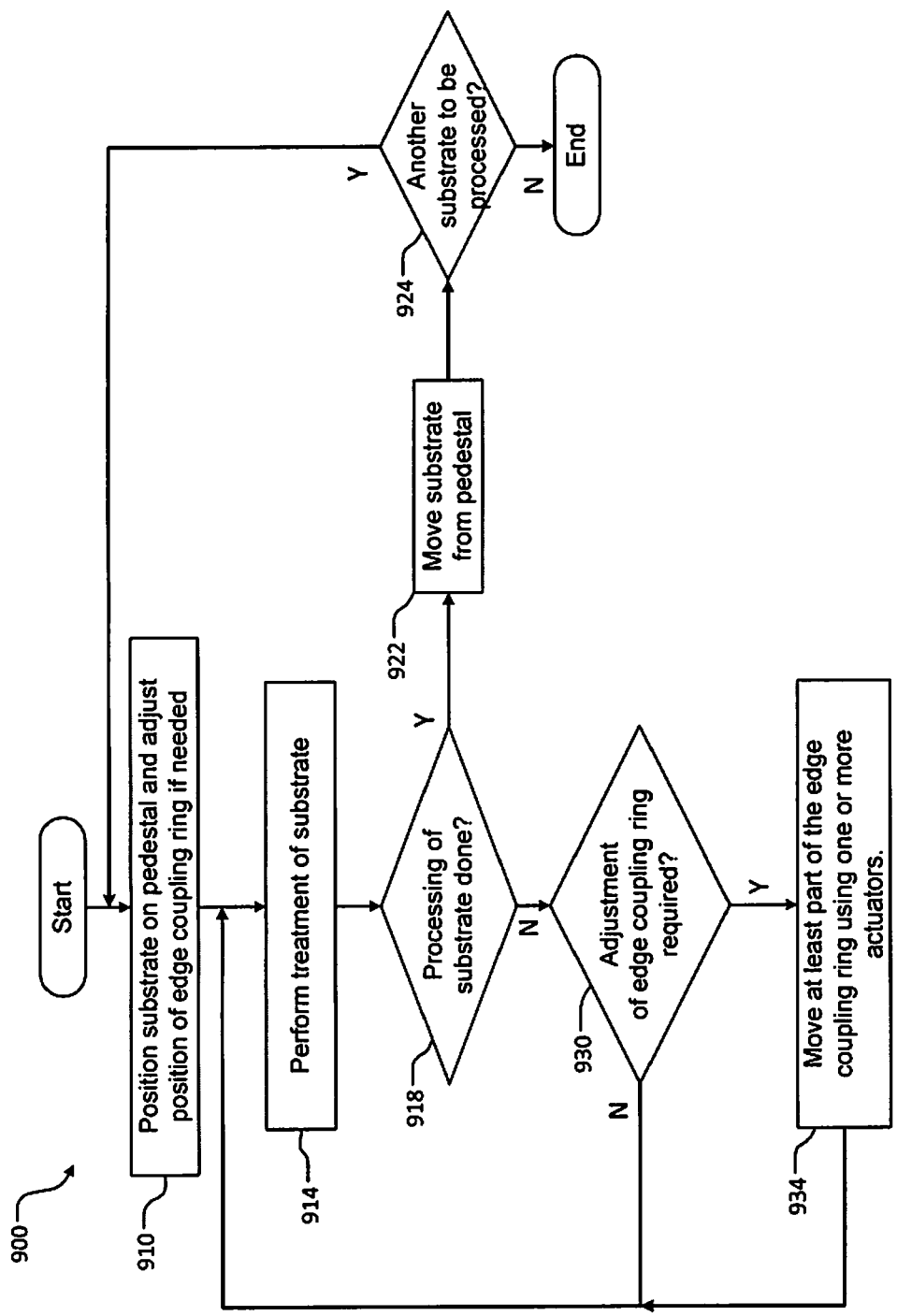
FIG. 14 illustrates an example of a method for moving an edge coupling ring during processing of a substrate.

Referring now to FIG. 14, a method 900 for moving an edge coupling ring during processing of a substrate is shown. In other words, different treatments may be performed on a single substrate in the same processing chamber. The edge coupling effect of the edge coupling ring may be adjusted between the multiple treatments performed on the substrate in the same processing chamber before proceeding to a subsequent substrate. At 910, a substrate is positioned on a pedestal and a position of the edge coupling ring is adjusted if needed. At 914, treatment of the substrate is performed. If processing of the substrate is done as determined at 918, the substrate is removed from the pedestal at 922. At 924, control determines whether another substrate needs to be processed. If 924 is true, the method returns to 910. Otherwise the method ends.

If 918 is false and the substrate needs additional treatment, the method determines whether adjustment of the edge coupling ring is required at 930. If 930 is false, the method returns to 914. If 930 is true, at least part of the edge coupling ring is moved using one or more actuators at 934 and the method returns to 914. As can be appreciated, the edge coupling ring can be adjusted between treatments of the same substrate in the same processing chamber.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system with selective edge profile tuning capability, comprising:
    a processing chamber;
    a pedestal arranged in the processing chamber;
    an edge coupling ring arranged adjacent to the pedestal, the edge coupling ring including a first portion located outside of and around a radially outer edge of the substrate;
    an actuator configured to selectively move the first portion of the edge coupling ring relative to (i) the substrate and (ii) a second portion of the edge coupling ring located radially inward of the first portion to alter an edge coupling profile of the edge coupling ring, wherein the actuator is configured to move the first portion to at least one position where an uppermost surface of the first portion is above an upper surface of the substrate; and
    a controller configured to control the actuator to move the edge coupling ring in response to erosion of the uppermost surface of the edge coupling ring, wherein controlling the actuator in response to the erosion includes (i) at least one of determining whether a predetermined number of etching cycles have occurred and determining whether a predetermined period of etching has occurred, and (ii) controlling the actuator to move the edge coupling ring directly in response to a determination that the predetermined number of etching cycles has occurred and/or the predetermined period of etching has occurred and without using a sensor measurement, subsequent to the determination, of an amount of the erosion,
    wherein the controller is further configured to (i) determine whether the actuator has moved the edge coupling ring a predetermined maximum number of times and (ii) selectively generate an indication that the edge coupling ring needs replacement in response to a determination that the actuator has moved the edge coupling ring the predetermined maximum number of times.

2. The substrate processing system of claim 1, further comprising:
    a gas delivery system configured to deliver process gas and carrier gas to the processing chamber; and
    a plasma generator configured to create plasma in the processing chamber to etch the substrate.

3. The substrate processing system of claim 1, wherein the actuator moves the first portion of the edge coupling ring without requiring the processing chamber to be opened.

4. The substrate processing system of claim 1, wherein the actuator is selected from a group consisting of a piezoelectric actuator, a stepper motor actuator, and a pneumatic drive actuator.

5. The substrate processing system of claim 1, wherein the actuator moves the first portion of the edge coupling ring vertically relative to the substrate.

6. The substrate processing system of claim 1, wherein the actuator moves the first portion of the edge coupling ring horizontally relative to the substrate.

7. The substrate processing system of claim 1, wherein the actuator selectively tilts the edge coupling ring relative to the substrate.

8. The substrate processing system of claim 1, wherein the actuator is located outside of the processing chamber and further comprising mechanical linkage connecting the actuator to the edge coupling ring through a wall of the processing chamber.

9. The substrate processing system of claim 8, further comprising a seal arranged between mechanical linkage member and the wall of the processing chamber.

10. The substrate processing system of claim 1, wherein the controller is configured to move the edge coupling ring to a first position for a first treatment of the substrate using a first edge coupling effect and then to a second position for a second treatment of the same substrate using a second edge coupling effect that is different than the first edge coupling effect.

* * * * *